United States Patent
Wang

(10) Patent No.: US 8,067,133 B2
(45) Date of Patent: Nov. 29, 2011

(54) PHASE SHIFT MASK WITH TWO-PHASE CLEAR FEATURE

(75) Inventor: Fei Wang, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 12/637,604

(22) Filed: Dec. 14, 2009

(65) Prior Publication Data

US 2010/0092878 A1    Apr. 15, 2010

Related U.S. Application Data

(63) Continuation of application No. 11/670,887, filed on Feb. 2, 2007, now Pat. No. 7,648,806.

(51) Int. Cl.
*G03F 1/00* (2006.01)

(52) U.S. Cl. .......................................................... 430/5

(58) Field of Classification Search .............. 430/5, 322, 430/323, 394
See application file for complete search history.

(56) References Cited

U.S. PATENT DOCUMENTS

| | | | |
|---|---|---|---|
| 4,687,543 A | 8/1987 | Bowker | |
| 5,384,219 A * | 1/1995 | Dao et al. ........................... | 430/5 |
| 5,728,494 A | 3/1998 | Kawano et al. | |
| 6,190,809 B1 | 2/2001 | Tzu et al. | |
| 6,207,333 B1 | 3/2001 | Adair et al. | |
| 6,238,825 B1 | 5/2001 | Lin | |
| 6,242,165 B1 | 6/2001 | Vaartstra | |
| 6,482,728 B2 | 11/2002 | Shin et al. | |
| 6,576,374 B1 | 6/2003 | Kim | |
| 6,579,808 B2 | 6/2003 | Cho et al. | |
| 6,649,532 B1 | 11/2003 | Chen et al. | |
| 6,716,758 B1 | 4/2004 | Donohue et al. | |
| 6,902,851 B1 | 6/2005 | Babcock et al. | |
| 6,902,854 B2 | 6/2005 | Frankowsky | |
| 6,919,274 B2 | 7/2005 | Kazumi et al. | |
| 6,939,794 B2 | 9/2005 | Yin et al. | |
| 6,969,895 B2 | 11/2005 | Han et al. | |
| 7,119,020 B2 | 10/2006 | Okamura et al. | |
| 7,131,102 B2 | 10/2006 | Dai et al. | |
| 7,670,756 B2 * | 3/2010 | Ishibashi et al. .............. | 430/311 |
| 2005/0009215 A1 | 1/2005 | Goto et al. | |
| 2005/0099078 A1 | 5/2005 | Vanhaelemeersch et al. | |
| 2005/0164478 A1 | 7/2005 | Chan et al. | |
| 2006/0019178 A1 | 1/2006 | Lee et al. | |

OTHER PUBLICATIONS

Bergeron, Resolution enhancement techniques for the 90-nm technology node and beyond, http://www.future-fab.com, Future Fab Intl., 2004, pp. 10 pages.

(Continued)

*Primary Examiner* — Stephen Rosasco
(74) *Attorney, Agent, or Firm* — Knobbe Martens Olson & Bear LLP

(57) ABSTRACT

Systems and methods are provided for use in photolithography. In one embodiment, a reticle is provided that comprises a phase shift and transmission control layer, wherein a gap in the phase shift and transmission control layer defines a line. Adjacent to the phase shift and transmission control layer is an optically transparent material, comprising a groove located within the line, wherein the groove comprises a region of reduced thickness in the optically transparent material. The region of reduced thickness serves to shift the phase of light passing through the groove, as compared to light passing through other regions of the optically transparent material. Thus, the reticle has a clear feature comprising light of two different phases.

12 Claims, 8 Drawing Sheets

OTHER PUBLICATIONS

Eurlings et al., 0.11um imaging in KrF lithography using dipole illumination, SPIE proceedings (SPIE proc. Ser.) International Society for Optical Engineering proceedings series, 2001, pp. 2 pages.

Ha et al., Reaction mechanism of trilevel resist etching in O2/SO2 plasma: controlling factors for sidewall passivation, Vacuum, Dec. 1998, vol. 51, Issue 4, pp. 519-524.

Higashi et al., Identifying front-end challenges for 90nm design, Electronic Eng. Times Asia, Sep. 1, 2003, pp. 3 pages.

Mancini et al., S-FIL for sub-80nm contact hole patterning, Solid State Technology Magazine, Feb. 2004, vol. 47, Issue 2, pp. 4 pages.

Naulleau et al., Line-edge roughness transfer function and its application to determining mask effects in EUV resist characterization, Applied Optics, Jun. 10, 2003, vol. 42, Issue 17, pp. 3390-3397.

Peterson et al., Approaches to reducing edge roughness and substrate poisoning of ESCAP photoresists, Semiconductor Fabtech, 8th Edition, pp. 183-188.

Advanced lithography: probing the limits of lithography, http://www.tpd.tno.nl/smartsite93.html, Mar. 2004, pp. 3 pages.

TCP 9400DFM—Silicon Etch Product Abstract, http://www.lamrc.com/products_5htm, Jul. 2004, pp. 1 page.

* cited by examiner

PHASE SHIFT MASK WITH TWO-PHASE CLEAR FEATURE

CROSS-REFERENCE TO RELATED APPLICATIONS

This application is a continuation of U.S. patent application Ser. No. 11/670,887, filed Feb. 2, 2007, the disclosure of which is hereby incorporated by reference in its entirety herein.

BACKGROUND OF THE INVENTION

1. Field of the Invention

Embodiments of the invention relate to photomasks or reticles for use in photolithography, and more particularly to reticles in which the clear feature comprises light of two different phases.

2. Description of the Related Art

Optical systems are widely used in the microelectronics industry to manufacture semiconductor wafers by a process known as photolithography. Typically, a photolithography system comprises a light source configured to project light rays to a condenser lens. The condenser lens collimates the light rays towards a pellicle placed before (or after) a reticle, sometimes referred to as a photomask. Typically, the reticle includes an optically transparent substrate underlying an optically opaque layer in a pattern used to project an image onto a portion of a photoresist-coated wafer. The pellicle is a substantially thin, optically transparent film which seals off the reticle surface from airborne particulates and other forms of contamination. Typically, a projection lens is placed after the reticle to receive and focus the pattern of light rays onto an exposure field on a photoresist ("resist") layer overlying a wafer. Exposed or unexposed portions of the photoresist are then developed, replicating the reticle pattern in the photoresist layer.

Improved systems and methods of photolithography have permitted formation of line features in integrated circuits below 100 nm. In some such systems, dipole illumination is used as a light source. As recounted by Mark Eurlings et al. in their paper, "0.11 µm Imaging in KrF Lithography Using Dipole Illumination," *Proc. of SPIE*, Volume 4404 (April 2001p) pp. 266-278, the disclosure of which is hereby incorporated in its entirety by reference, dipole illumination advantageously enhances the exposure latitude and depth of focus for dense structures. However, the inventor has found using dipole illumination to be problematic for printing certain structures. In particular, when lines are oriented in the preferred direction of a dipole source, imperfections have been found in the interior of the line. These imperfections are called scumming, and they undesirably reduce the quality of the features formed on the integrated circuit. Features having a width substantially smaller than the space to the next feature being defined by the same mask, such as isolated trench lines, appear to be more susceptible to scumming than features printed in dense portions of the integrated circuit. For example, a dense array of lines may include parallel lines separated by a distance approximately equal to the width of the lines, while an isolated trench line may be separated from the next feature formed by the same mask by a distance greater than the width of the line, for example greater than or approximately equal to about five times the width of the trench line. Accordingly, a reticle is desired that reduces scumming and thereby enhances image quality on the integrated circuit.

BRIEF DESCRIPTION OF THE DRAWINGS

The appended drawings are schematic, not drawn to scale, and are meant to illustrate and not to limit embodiments of the invention.

DETAILED DESCRIPTION OF EMBODIMENTS

When lines are printed in the direction of a dipole source orientation, scumming has been found to adversely affect the quality of the pattern on the photodefinable layer. Embodiments described herein provide systems and methods of photolithography that reduce scumming within the pattern.

As used herein, "reticle" refers to a fully-formed reticle (i.e., reticle ready for use in photolithography) or a partially-formed reticle at any stage in the process of forming the reticle. A reticle can include one or more layers of an optically opaque, optically transparent, optically low transmission materials and optically high transmission materials. As an example, a reticle can include a molybdenum doped silicon ("MoSi") layer over a quartz substrate. As another example, a reticle can include chrome and MoSi layers over a quartz substrate. As yet another example, an in-process reticle can include a photodefinable layer over a MoSi layer that in turn overlies a quartz substrate. As still another example, a reticle can include a quartz substrate, a MoSi layer over the quartz substrate, and a pellicle over the MoSi layer. As another example, a reticle can include a quartz substrate prior to application of any overlying layers.

Since the advent of the integrated circuit (IC), semiconductor chip features have become exponentially smaller and the number of transistors per device exponentially larger. Advanced IC's with hundreds of millions of transistors at feature sizes of 250 nanometers, 180 nm, 100 nm, and less are becoming routine. Improvement in overlay tolerances in optical photolithography and the introduction of new light sources with progressively shorter wavelengths have allowed optical steppers to significantly reduce the resolution limit for semiconductor fabrication far below one micron.

There are various types of reticles available in the art. Binary masks can comprise a pattern (e.g., an integrated circuit (IC) pattern) formed in a layer of an opaque material (e.g., chrome or chrome oxide) overlying a transparent substrate (e.g., quartz). The pattern may be formed using any lithographic technique known in the art, such as standard optical photolithography or electron-beam lithography.

Figure 1A:
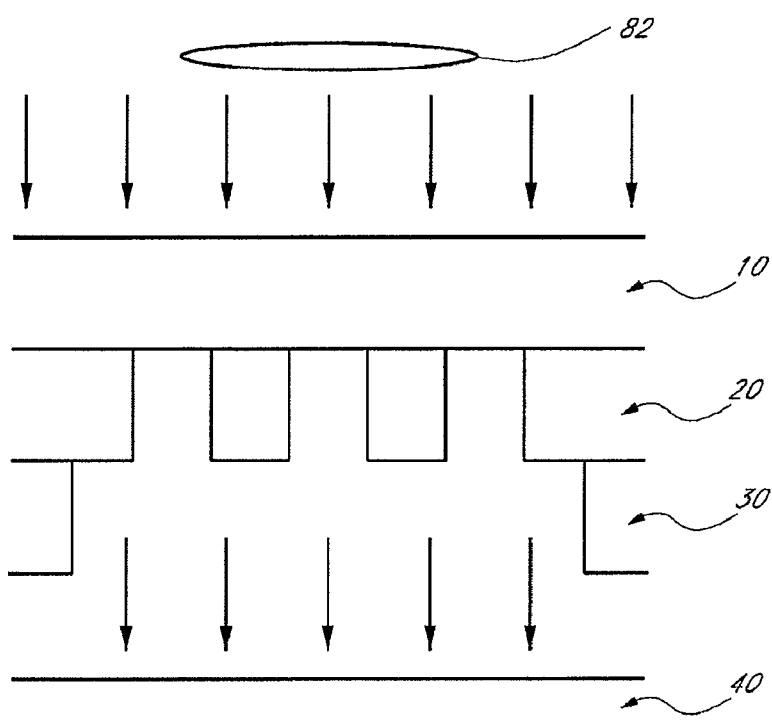
FIG. 1A is a cross-sectional side view of a known attenuated phase shift mask.

Attenuated phase shift masks (APSMs) have provided improved image contrast and lithographic resolution over standard binary masks. FIG. 1A shows a typical APSM. An APSM comprises an optically transparent material 10 (e.g., quartz substrate) adjacent to a layer of an optically low-transmission material 20, such as molybdenum doped silicon oxynitride or molybdenum doped silicon oxide (also known as "MoSi"). The APSM may also include an opaque layer 30 that blocks light from passing through the reticle.

An APSM forms shift patterns through adjacent areas of the transparent and low-transmission materials. Unlike an optically opaque material, such as chrome, MoSi allows a small percentage of light from light source 82 to pass through. However, the amount that passes through is "weak" and does not chemically alter the photoresist on the wafer 40, at least not to the extent distinguished by the development process. The light that does pass through is 180° out of phase compared to the light passing through neighboring quartz areas. Therefore, where the patterns of the low-transmission material and the quartz meet, light interferes in such a way as to sharpen the edges of the design, producing a faithful replica of the intended pattern in the resist. Approximately 6% of light that is incident on the layer of an optically low-transmission material 20 of an APSM is transmitted through the reticle.

High transmission attenuated reticles (HTARs) are similar to APSMs, with the exception that the thickness of low-transmission material layer is reduced relative to that of an APSM. Depending on the thickness of the layer of the optically low transmission material, about 18% or 30% of light that is incident on the layer of the optically low transmission material of an HTAR is transmitted through the reticle.

Figure 1B:
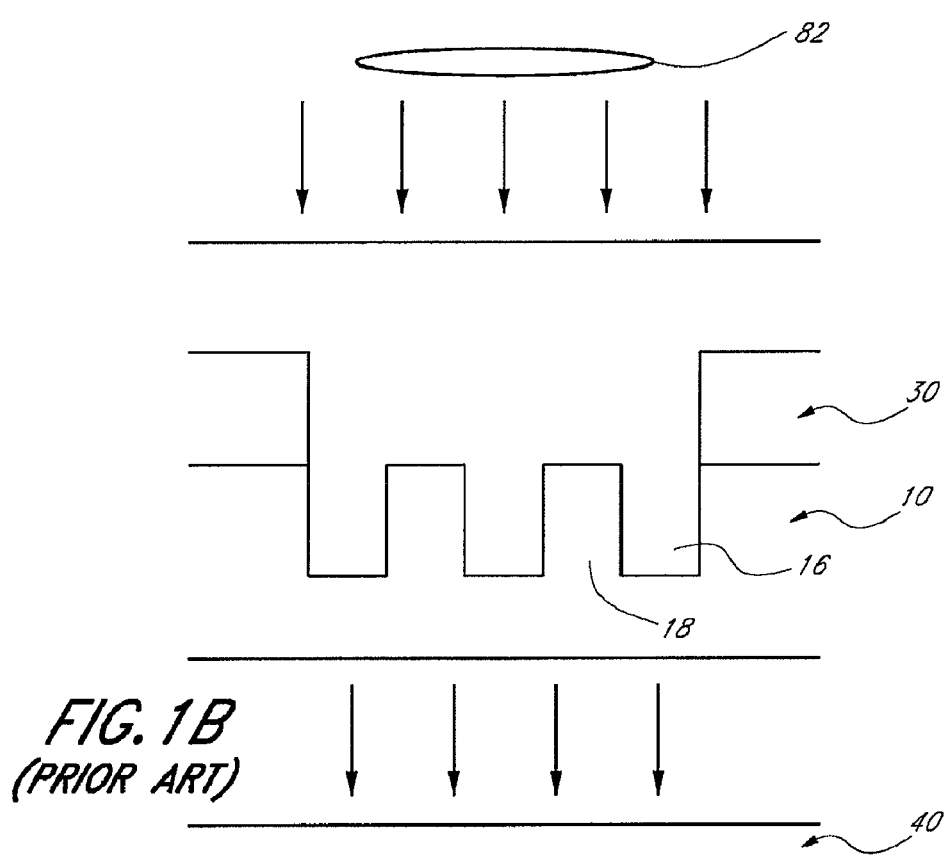
FIG. 1B is a cross-sectional side view of a known alternating phase shift mask.

Alternating Phase-Shift Masks (AltPSMs) are another known type of reticle, which are shown in FIG. 1B. AltPSMs employ an opaque material 30 and a transparent material 10 to form a feature on a wafer 40. AltPSMs also shift the phase of light from a light source 82, such that some of the light transmitted through the mask is 180° out of phase with light transmitted through a neighboring portion of the mask. However, AltPSMs utilize two different thicknesses of a single transparent material 10 (e.g., quartz) to shift the phase of light waves rather than a low-transmission material (e.g., MoSi). In AltPSMs, a portion of the quartz 10 is etched so that the light passing through the etched quartz 16 will be 180° out of phase with the light that passes through the unetched quartz 18. However, neither APSMs nor AltPSMs have been found to eliminate scumming in lines printed in the direction of a dipole source orientation.

Figure 2A:
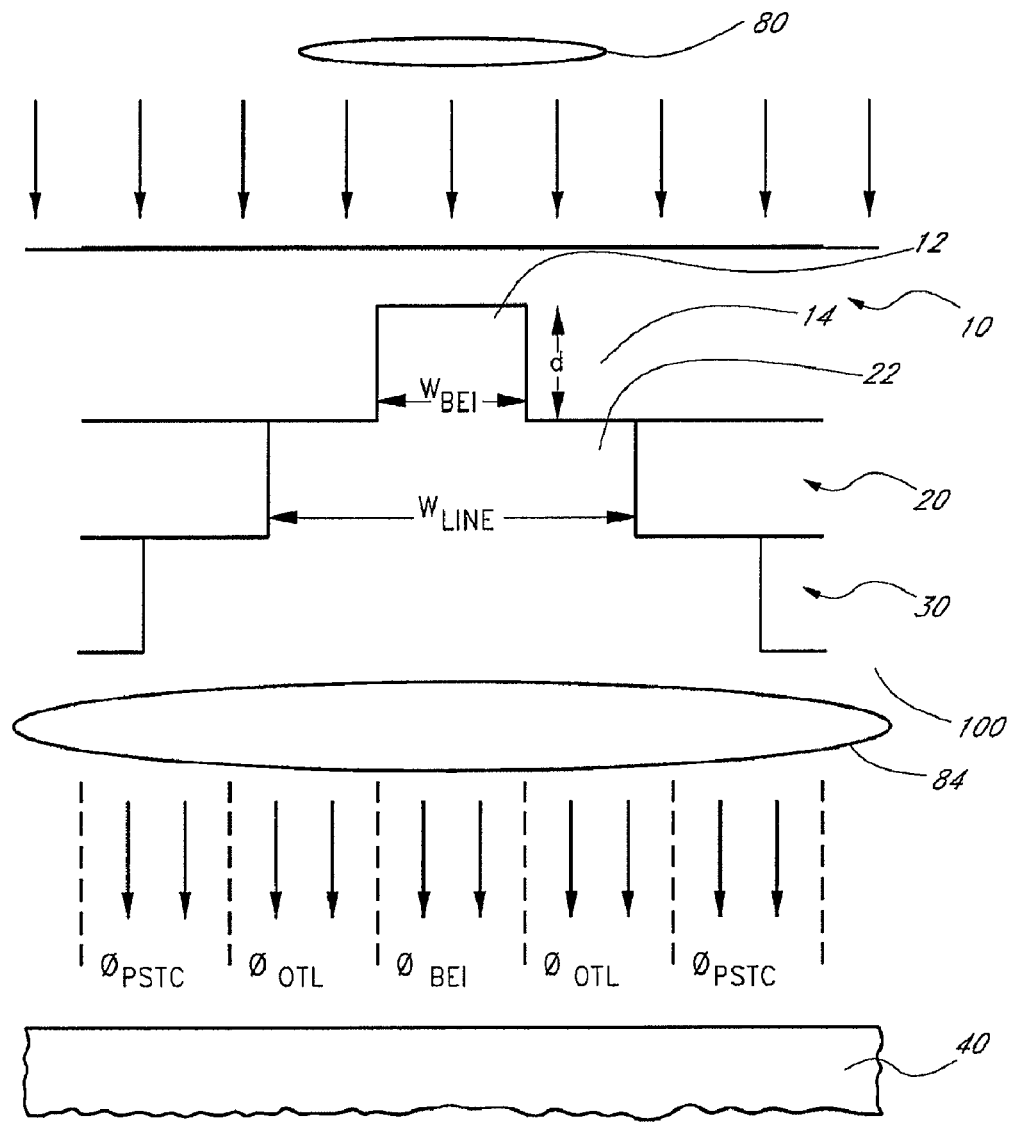
FIG. 2A is a schematic, cross-sectional side view of a reticle in accordance with an embodiment of the present invention.

FIG. 2A illustrates a reticle 100 in accordance with an embodiment of the present invention. The reticle 100 comprises a phase shift and transmission control layer 20, wherein a gap 22 in the phase shift and transmission control layer 20 defines a line of width "$W_{LINE}$." In some embodiments where a projection lens system 84 is 4× in magnification, the line width $W_{LINE}$ is less than or equal to 400 nm to define a line of less than or equal to about 100 nm on the substrate 40. The phase shift and transmission control layer 20 shifts the phase and controls the transmission of light passing through. In some embodiments, light passing through the phase shift and transmission control layer 20 exits 160° to 200°, more particularly 175° to 185° out of phase relative to light passing through regions of the optically transparent layer 10. The phase shift and transmission control layer 20 permits only a small amount of light to pass through, preferably 20% or less, more preferably 6% or less. Accordingly, the phase shift and transmission control layer 20 is part of the dark field of the reticle. The dark field is that portion of the reticle 100 that does not transmit a sufficient amount of light to chemically alter a photoresist on the substrate 40, at least not to the extent distinguishable by the development process. On the other hand, the clear feature is the portion of the reticle 100 that does transmit sufficient light to chemically alter the photoresist relative to the dark field. In the embodiment illustrated in FIG. 2A, the clear feature includes the portions of the optically transparent layer 20 within the gap 22.

The phase shift and transmission control layer 20 may comprise a metal-doped silicon, such as molybdenum-doped silicon oxide ($MoSi_xO_y$) or molybdenum-doped silicon oxynitride ($MoSi_xO_yN_z$), wherein "x", "y" and "z" are numbers greater than zero. Alternatively or in addition, the phase shift and transmission control layer 20 may comprise tantalum hafnium ($Ta_xHf_y$), tantalum nitride ($Ta_xN_y$) and silicon oxynitride ($SiO_xN_y$), wherein "x", "y" and "z" are numbers greater than zero.

The reticle 100 further comprises an optically transparent material 10 adjacent to the phase shift and transmission control layer 20. According to some embodiments, the optically transparent material 10 may be formed of quartz, such as a conventional quartz plate with a thickness between about 0.1 inch (0.254 cm) and 1.5 inches (3.81 cm), e.g., about 0.25 inch (6.35 mm). The optically transparent material 10 comprises a groove 12 located inside the line defined by the gap 22. The groove 12 comprises a region of reduced thickness, relative to other portions of the optically transparent material 10. The portions of the optically transparent material 10 inside the line defined by the gap 22 other than the groove 12 are shown in FIG. 2A as neutral regions 14. The groove 12 can also be referred to as a back-etched inrigger, so named because in some embodiments it is formed by etching into the quartz.

The groove 12 has width "$W_{BEI}$" and depth "d." In certain embodiments, $W_{BEI}$ can be equal to approximately ¼ to ½ of $W_{LINE}$, more particularly 30% to 35% of $W_{LINE}$. In order to eliminate error typically associated with asymmetry, the illustrated groove 12 is located in approximately the center of the line defined by gap 22. It can be seen from FIG. 2A that the groove depth "d" is also equal to the difference in thickness of the optically transparent material 10 at the groove 12 compared to the neutral regions 14.

This difference in thickness at the groove 12 serves to shift the phase of light, relative to light passing through the neutral regions 14. In some embodiments, the light passing through the reticle 100 is supplied by a dipole illumination source 80. In such embodiments, the phase shift in portions of the clear feature of the reticle 100 has been observed to reduce scumming in lines printed in the direction the dipole source 80 is oriented. Without wishing to be limited by theory, it is believed that the phase shift reduces scumming because it provides a constructive imaging modulation inside the line feature where groove 12 is located.

The value of "d" may be selected to achieve the desired phase shift, according to the equation:

$$(n-1) \times (d) = (\phi_\Delta) \times (\lambda) \times (M)$$

where "n" is the refractive index of the optically transparent layer 10, "λ" is the wavelength of light being used, and "M" is the magnification factor of the projection lens system. In the equation, "$\phi_A$" is the fraction of phase shift in light passing through the groove 12. For example, if a phase shift of −180° were desired, a value of ½ would be used for $\phi_A$. Similarly, if a phase shift of −90° were desired, a value of ¼ would be used for $\phi_A$.

In some embodiments, it is desirable to shift the phase of light passing through the groove 12 by −60° to −180° relative to light passing through neutral region 14 of the optically transparent layer 10. For example, it has been found advantageous for light passing through the groove 12 to exit −90° to −180° out of phase relative to light passing through the neutral region 14. More particularly, light passing through the groove 12 exits −120° to −150° out of phase relative to light passing through the neutral region 14, resulting in reduced scumming. Hence, in some embodiments where quartz is used in the optically transparent layer 10, and light of wavelength 193 nm to 248 nm is used, "d" is equal to 533 nm to 685 nm.

Figure 2B:
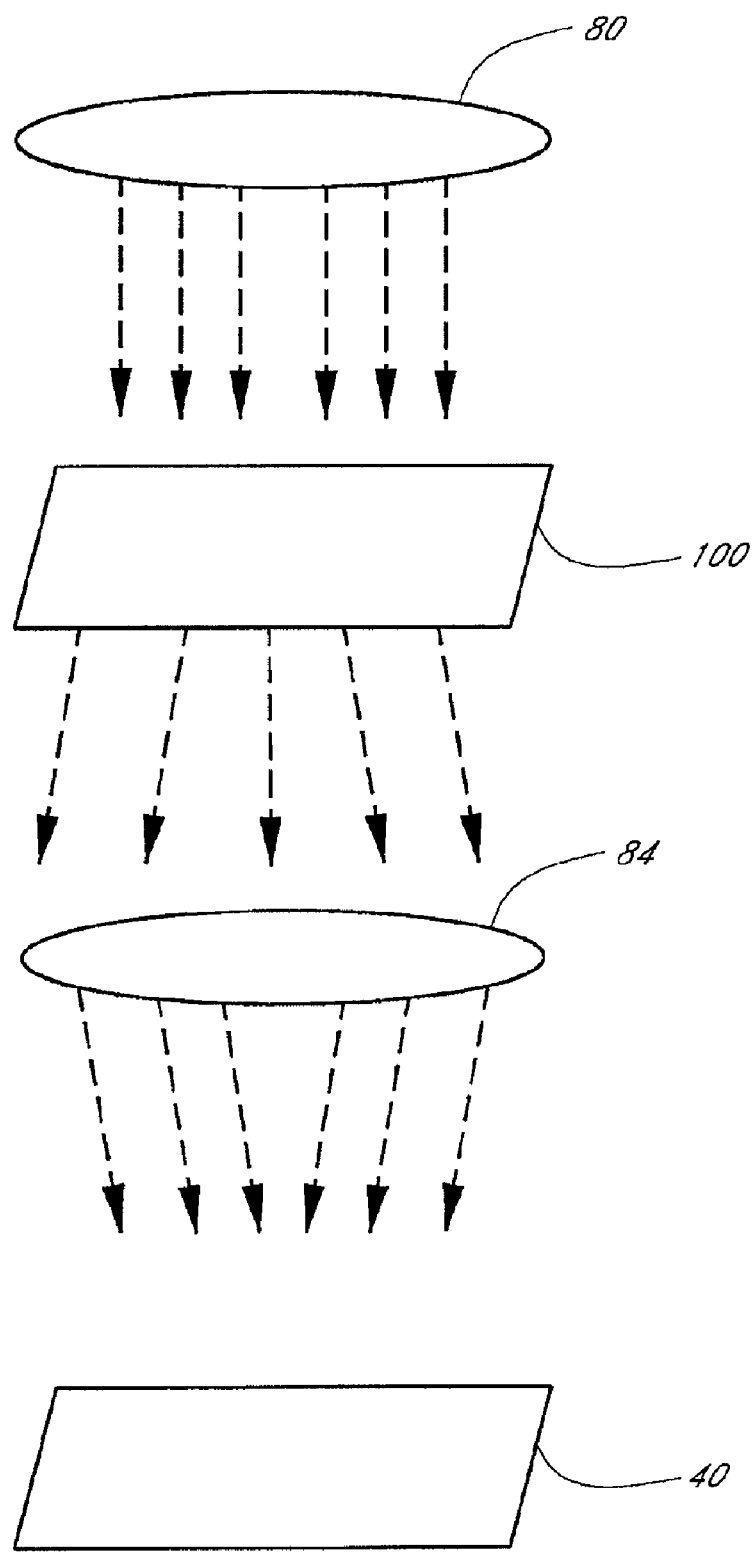
FIG. 2B is a schematic view of a system in accordance with an embodiment of the present invention.

In certain embodiments, as shown in FIG. 2A, the optically transparent layer 10 is disposed between the dipole illumination source 80 and the phase shift and transmission control layer 20, such that light passes through the optically transparent layer 10 before reaching the phase shift and transmission control layer 20. FIG. 2B shows a photolithography system according to some embodiments, in which light passes from the dipole illumination source 80 through the reticle 100, then through the projection lens system 84 before reaching the substrate 40.

In some embodiments, as shown in FIG. 2A, the reticle 100 may further comprise an optically opaque layer 30 adjacent to the phase shift and transmission control layer 20. The optically opaque layer 30 may comprise a metal or a metal compound or alloy, such as chromium or chromium oxide.

Figure 3:
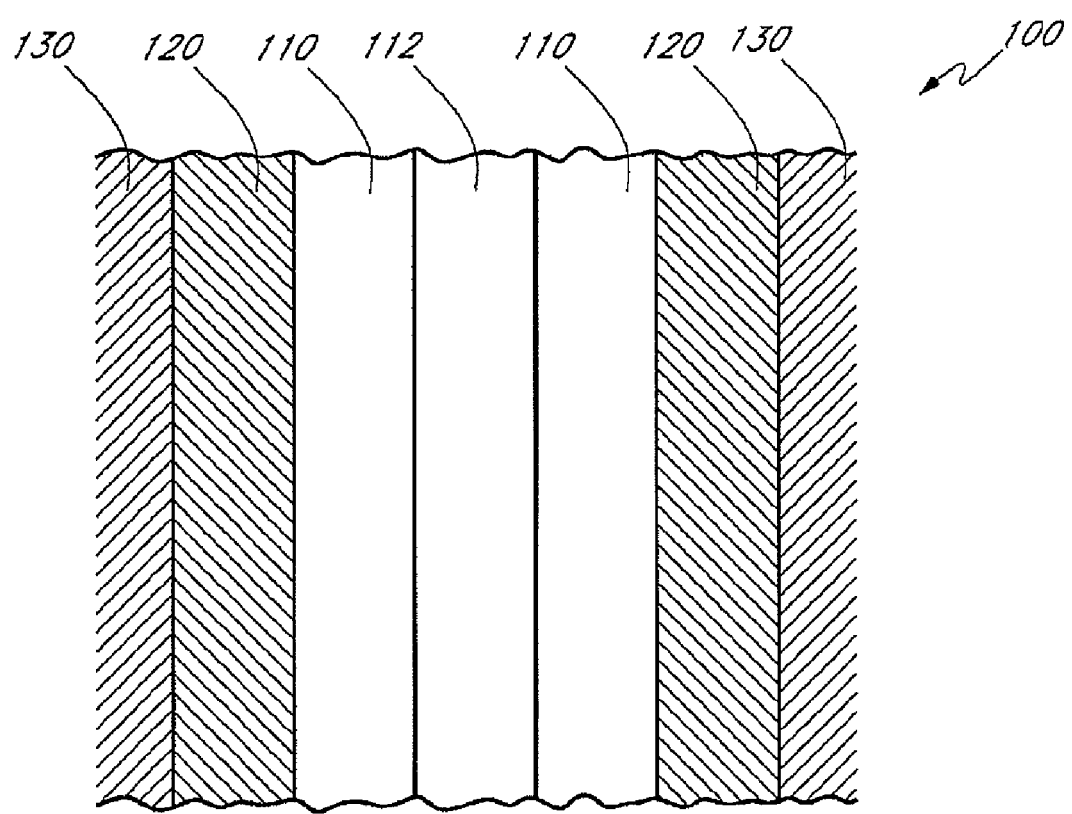
FIG. 3 is a schematic top-down view of a reticle in accordance with an embodiment of the present invention.

In the embodiment shown in FIG. 3 (a top plan view of FIG. 2A), the reticle 100 comprises a first phase region 110; a second phase region 120, wherein light passing through the second phase region 120 exits approximately 160° to 200°, more particularly 175° to 185° out of phase relative to light passing through the first phase region 110; and a third phase region 112, wherein light passing through the third phase region 112 exits approximately −60° to −180° out of phase relative to light passing through the first phase region 110. More particularly, light exiting from the third phase region 112 is −90° to −180° out of phase, such as −120° to −150° out of phase, relative to light exiting the first phase region 110.

The first phase region 110 and the third phase region 112 may both be defined by an optically transparent material, such as quartz. The second phase region 120 includes a metal-doped silicon, such as molybdenum-doped silicon oxide ($MoSi_xO_y$) or molybdenum-doped silicon oxynitride ($MoSi_xO_yN_z$), wherein "x", "y" and "z" are numbers greater than zero. Alternatively or in addition, the second phase region 120 may comprise tantalum hafnium ($Ta_xHf_y$), tantalum nitride ($Ta_xN_y$) and silicon oxynitride ($SiO_xN_y$), wherein "x", "y" and "z" are numbers greater than zero. In some embodiments, the reticle 100 may further comprise an optically opaque region 130. The optically opaque region 130 may be formed of a metal or a metal alloy, such as chromium or chromium oxide.

Figure 4:
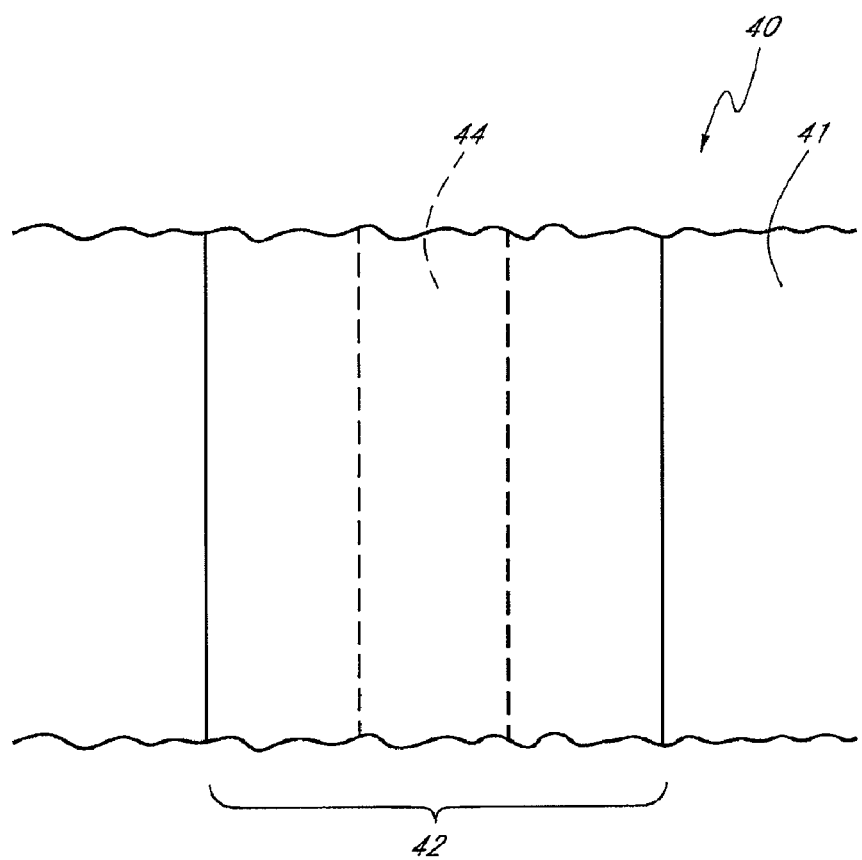
FIG. 4 is a schematic top-down view of a wafer for use in conjunction with a reticle in accordance with an embodiment of the present invention.

In a preferred embodiment, when viewed from the perspective of the light source, as shown in FIG. 3, the third phase region 112 is bordered on either side by the first phase regions 110. Each first phase region 110 is bordered on one side by the second phase region 120 and on the other side by the third phase region 112. FIG. 4 is a schematic top plan view of a substrate 40 that has been exposed to light that has passed through the reticle 100 of FIG. 3. The substrate 40 comprises a photoresist layer 41 that is chemically altered when exposed to a sufficient amount of light. The pattern of the reticle determines the pattern formed in the photoresist layer 41, and the pattern of the photoresist layer 41 in turn determines the pattern subsequently formed by metal deposited on the substrate 40. In some embodiments, the patterning process could be used in a conventional process, in which lines in the photoresist layer correspond to lines of metal blanket deposited on the substrate and thus etched through the patterned photoresist mask. In other embodiments, the patterning process could be used in a damascene process, in which lines in the photoresist layer are used to etch damascene trenches and thus correspond to gaps between metal lines.

Figure 5:
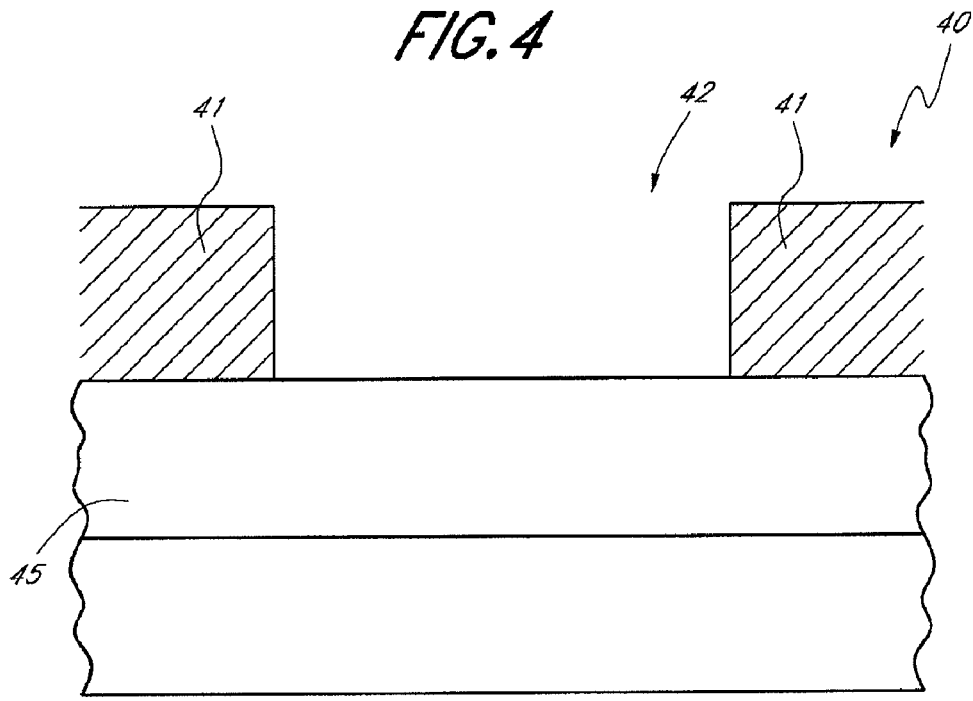
FIG. 5 is a schematic, cross-sectional side view of a wafer for use in conjunction with a reticle in accordance with an embodiment of the present invention.
Figure 6:
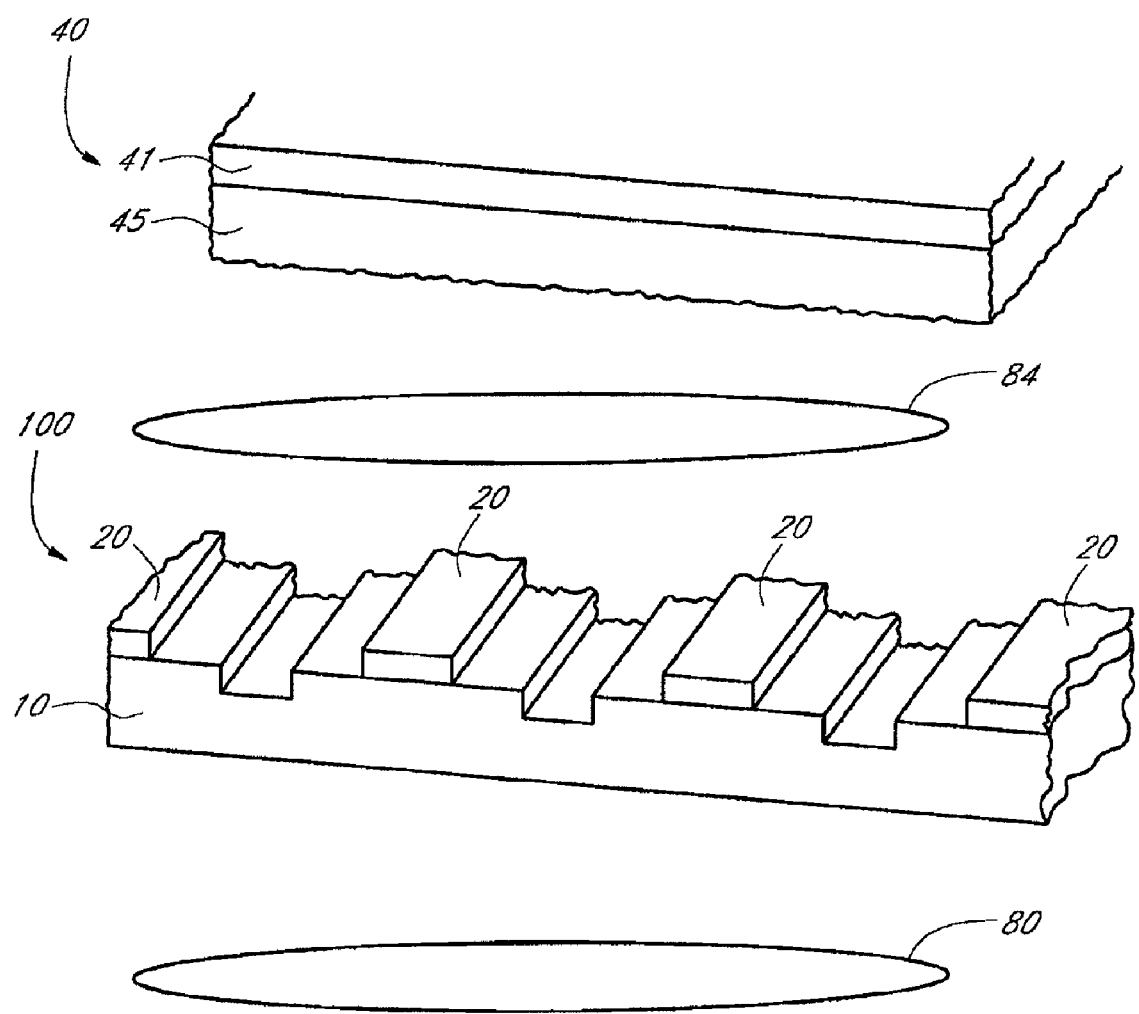
FIG. 6 is a schematic view of a system in accordance with an embodiment of the present invention.
Figure 7:
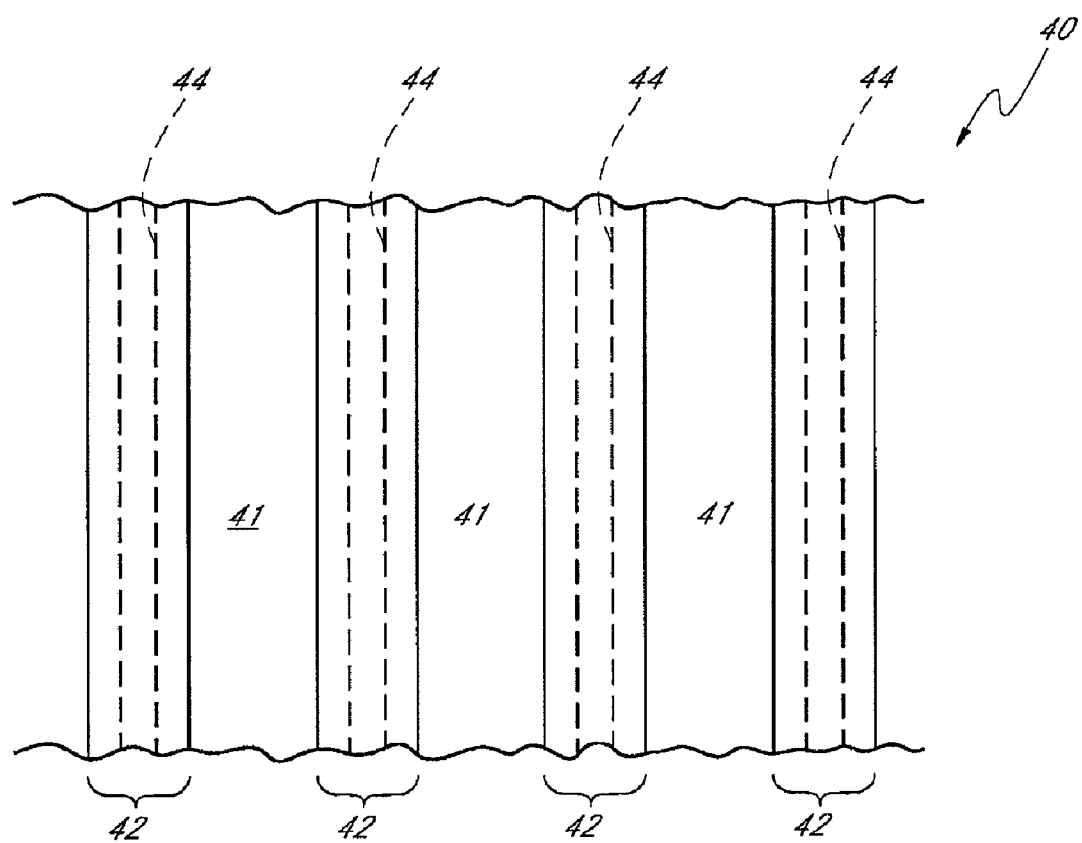
FIG. 7 is a schematic top-down view of a wafer for use in conjunction with a reticle in accordance with an embodiment of the present invention.
Figure 8:
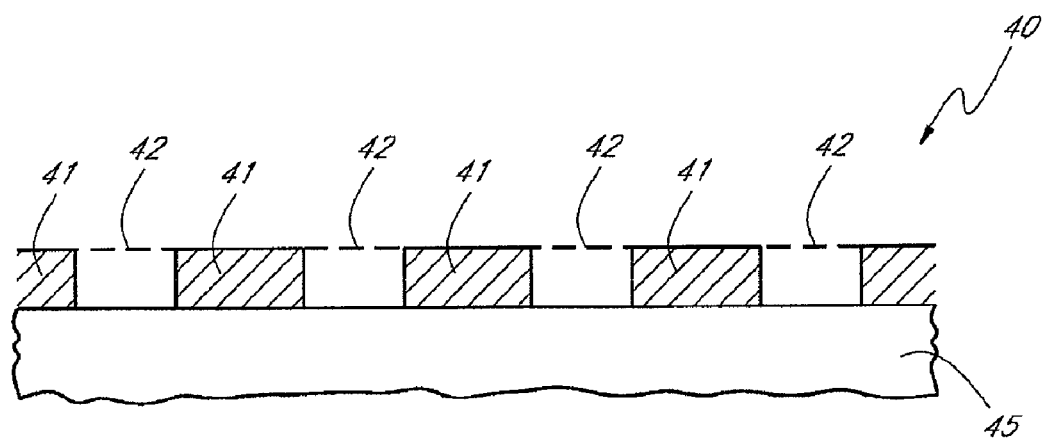
FIG. 8 is a schematic, cross-sectional side view of a wafer for use in conjunction with a reticle in accordance with an embodiment of the present invention.

As shown in FIGS. 4 and 5, the boundaries of the first phase region and the second phase region may define a line feature 42 to be formed on substrate 40 over a layer or structure 45 to be patterned. Note that the line feature 42 in the resist could correspond to a conductive line (conventional metallization, in which case the structure 45 can be a metal layer) or to gaps between conductive lines (damascene processing, in which case the structure 45 to be patterned can be an insulating layer) as described above. In some embodiments the structure 45 is simply the upper surface of the substrate 40 itself, e.g. when trenches are to be formed in the substrate. Further, the boundaries of the first phase region and the third phase region may define a phase shift zone 44 within the line feature 42. The phase shift zone 44 preferably has a width equal to approximately ¼ to ½ the width of the line feature 42, and more preferably approximately 30% to 35% the width of the line feature 42. The phase shift zone 44 may not be distinguishable from other portions of the substrate 40 within the line feature 42, because in all portions of the line feature 42 sufficient light has passed through the reticle to chemically alter the photoresist layer 41 of the substrate 40.

Figure 9:
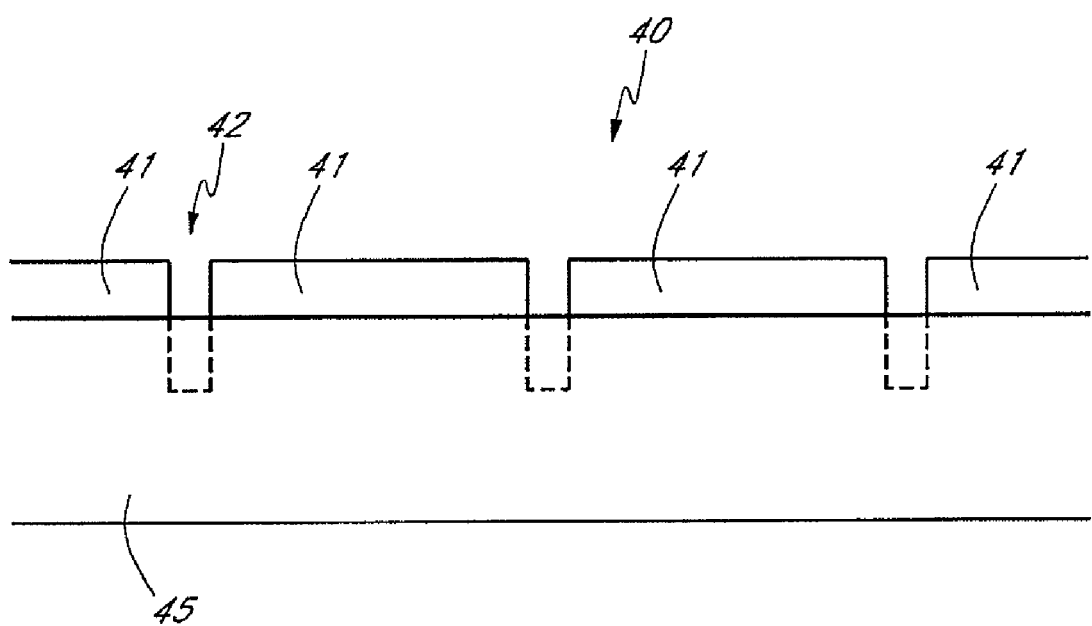
FIG. 9 is a schematic, cross-sectional side view of a wafer for use in conjunction with a reticle in accordance with an embodiment of the present invention.

While embodiments have been described in which the feature formed on the photoresist layer of the substrate is a line, the reticle is of particular utility for a mask layer with a plurality of gaps defining an array of parallel lines, as shown in FIGS. 6-9. The lines may be formed as part of a memory array, such as word lines or bit lines. When such reticles are used in conjunction with a dipole illumination source, the array of lines defined by the gaps in the mask layer may be oriented in the direction of the dipole source orientation. As shown in FIG. 9, the line feature 42 may be isolated trench lines and the spacing between the line features 42 may be substantially greater than the line width. For example, the distance between lines may be greater than or approximately equal to about five times the width of the trench line. In some embodiments, the pitch of the array pattern on the chip can be between about 100 nm and 1000 nm and the line width may be between about 50 nm and 200 nm.

In accordance with the embodiments described above, a reticle is provided for use in photolithography. The reticle comprises a phase shift and transmission control layer, wherein a gap in the phase shift and transmission control layer defines a line. Adjacent to the phase shift and transmission control layer is an optically transparent material, comprising a groove located within the line, wherein the groove comprises a region of reduced thickness in the optically transparent material.

In other embodiments, a reticle comprises a first phase region, a second phase region and a third phase region. Light passing through the second phase region exits approximately 175° to 185° out of phase relative to light passing through the first phase region. Light passing through the third phase region exits approximately −60° to −180° out of phase relative to light passing through the first phase region.

In other embodiments, a photolithography system is provided. The system comprises a dipole illumination source and a reticle. The reticle comprises a mask layer and an optically transparent material adjacent to the mask layer. The mask layer comprises a material selected to reduce the transmission and shift the phase of light passing through the mask layer, and includes at least one gap. The optically transparent material comprises at a first region of greater thickness and a second region of lesser thickness, wherein the gap exposes both the first and second regions.

In other embodiments, a method is provided for forming a feature on a substrate. The method comprises providing a light source, a reticle, and a substrate. The method further comprises transmitting light from the light source to the reticle, the reticle comprising a clear feature and a dark field, the clear feature comprising a first region and a third region, and the dark field comprising a second region. The method further comprises phase-shifting light passing through the second region 160° to 200° out of phase relative to light passing through the first region; phase-shifting light passing through the third region −60° to −180° out of phase relative to light passing through the first region; and patterning a feature on the substrate by exposing the substrate to light from the light source transmitted through the reticle.

It will be appreciated by those skilled in the art that various other omissions, additions and modifications may be made to the methods and structures described above without departing from the scope of the invention. All such changes are intended to fall within the scope of the invention, as defined by the appended claims.

What is claimed is:

1. A method of forming a feature on a substrate, comprising:
    transmitting light from a light source to a reticle, the reticle comprising a clear feature and a dark field, the clear feature comprising a first region and a third region, and the dark field comprising a second region and a fourth region;
    phase-shifting light passing through the second region by between 160° and 200° out of phase relative to light passing through the first region;
    phase-shifting light passing through the third region by between −60° and −180° out of phase relative to light passing through the first region;
    blocking substantially all light passing through the fourth region; and
    patterning the feature on the substrate by exposing the substrate to light from the light source transmitted through the reticle.

2. The method of claim 1, wherein patterning comprises exposing the reticle to the light source comprising a dipole illumination source.

3. The method of claim 2, wherein patterning the feature comprises defining a line feature oriented substantially along the direction of the dipole illumination source orientation.

4. The method of claim 1, wherein defining the line feature comprises forming the feature with a width less than or equal to 100 nm.

5. The method of claim 1, wherein the third region is adjacent to the first region and the first region is adjacent to the second region.

6. The method of claim 1, wherein transmitting light comprises permitting 20% or less of the light transmitted to the second region of the reticle to pass through the second region.

7. The method of claim 1, wherein transmitting light comprises permitting 6% or less of the light transmitted to the second region of the reticle to pass through the second region.

8. A method of forming a line on a substrate, comprising:
    transmitting light from a light source to a reticle, the reticle comprising:
        a phase shift and transmission control layer configured to permit at least some of the transmitted light to pass therethrough, wherein a gap in the phase shift and transmission control layer defines the line, and
        an optically transparent material adjacent to the phase shift and transmission control layer, comprising a groove located within the line, wherein the groove comprises a region of reduced thickness in the optically transparent layer, and wherein the groove is narrower than the line;
    passing light from the light source through the reticle; and
    patterning the line on the substrate by exposing the substrate to light from the light source that has passed through the reticle.

9. The method of claim 8, wherein passing light through reticle comprises phase-shifting the light such that light passing through at the groove is between −60° and −180° out of phase with light passing through other portions of the optically transparent material.

10. The method of claim 8, wherein passing light through reticle comprises phase-shifting the light such that light passing through the groove exits between −120° and −150° out of phase relative to light passing through a neutral region, wherein the neutral region is a region of the optically transparent material other than the groove.

11. The method of claim 10, wherein passing light through reticle comprises phase-shifting the light such that light passing through the phase shift and transmission control layer exits between 175° and 185° out of phase relative to light passing through the neutral region.

12. The method of claim 8, wherein transmitting comprises transmitting light from a dipole illumination source having a dipole illumination source orientation, and patterning comprises patterning the line oriented substantially along the direction of the dipole illumination source orientation.

* * * * *